(12) United States Patent
Strobel

(10) Patent No.: US 12,292,163 B2
(45) Date of Patent: May 6, 2025

(54) METHOD AND DEVICE FOR PRECOOLING A CRYOSTAT

(71) Applicant: Bruker BioSpin GmbH & Co. KG, Ettlingen (DE)

(72) Inventor: Marco Strobel, Karlsruhe (DE)

( * ) Notice: Subject to any disclaimer, the term of this patent is extended or adjusted under 35 U.S.C. 154(b) by 1616 days.

(21) Appl. No.: 16/207,404

(22) Filed: Dec. 3, 2018

(65) Prior Publication Data

US 2019/0101244 A1   Apr. 4, 2019

Related U.S. Application Data

(62) Division of application No. 15/225,094, filed on Aug. 1, 2016, now Pat. No. 10,203,068.

(30) Foreign Application Priority Data

Aug. 20, 2015 (DE) .................... 10 2015 215 919.1

(51) Int. Cl.
| | |
|---|---|
| *F17C 3/08* | (2006.01) |
| *F17C 13/00* | (2006.01) |
| *F25B 9/10* | (2006.01) |
| *F25D 19/00* | (2006.01) |
| *G01R 33/38* | (2006.01) |

(Continued)

(52) U.S. Cl.
CPC ............... *F17C 3/085* (2013.01); *F17C 3/08* (2013.01); *F17C 13/007* (2013.01); *F25B 9/10* (2013.01); *F25D 19/006* (2013.01); *G01R 33/3804* (2013.01); *H01F 6/04* (2013.01); *F25B 9/14* (2013.01); *F25B 2400/17* (2013.01)

(58) Field of Classification Search
CPC .... F17C 3/08; F17C 3/085; F17C 3/10; F17C 13/007; F25B 9/14; G01R 33/3804; H01F 6/04
USPC ....................................... 62/6, 51.1
See application file for complete search history.

(56) References Cited

U.S. PATENT DOCUMENTS

| | | | |
|---|---|---|---|
| 2004/0060303 A1* | 4/2004 | Haberbusch | ............ F02G 1/043 62/6 |
| 2007/0271933 A1* | 11/2007 | Miki | ..................... C01B 3/0089 62/51.1 |

(Continued)

OTHER PUBLICATIONS

Zia, J.H., "A Pulse Tube Cryocooler with 300W Refrigeration at 80K and an Operating Efficiency of 19% Carnot", Cryocooler 14, ICC press (2008), pp. 141-147.*

*Primary Examiner* — John F Pettitt, III
(74) *Attorney, Agent, or Firm* — Benoît & Côté Inc.

(57) ABSTRACT

A method is provided for precooling a cryostat having a hollow cold head turret into which a neck tube protrudes and connects an object to be cooled to the exterior of the cryostat, wherein a cold head having a cold head stage for cooling a cryogenic working medium may be introduced into the neck tube. During a condensation operation the cryogenic working medium flows through a heat pipe into an evaporator chamber which is thermally conductively connected to the object to be cooled. During a precooling phase a precisely fitting, thermally conductive short circuit block is inserted through the neck tube into the heat pipe to provide thermal conduction between the object to be cooled and a cooling device. The short circuit block is removed from the heat pipe after the target temperature is reached, and heat is subsequently transmitted through the heat pipe during a condensation operation.

19 Claims, 4 Drawing Sheets

(51) Int. Cl.
  *H01F 6/04*   (2006.01)
  *F25B 9/14*   (2006.01)

(56) References Cited

U.S. PATENT DOCUMENTS

| | | | |
|---|---|---|---|
| 2009/0293505 A1* | 12/2009 | Wang | F25B 9/14 |
| | | | 62/51.1 |
| 2011/0179808 A1* | 7/2011 | Kagan | H01F 6/04 |
| | | | 62/48.2 |
| 2017/0167760 A1* | 6/2017 | Clarke | F25D 19/006 |

* cited by examiner

METHOD AND DEVICE FOR PRECOOLING A CRYOSTAT

BACKGROUND OF THE INVENTION

Field of the Invention

The invention relates to a method for operating a cryostat which houses a chamber containing at least one object to be cooled.

Description of the Related Art

A cryostat is described in patent application DE 10 2014 218 773, unpublished at the time of filing of the present invention, that comprises a vacuum container having at least one hollow cold head turret which contains a neck tube connecting a chamber containing at least one object to be cooled through the outer shell of the vacuum container to the area outside of the cryostat, the neck tube being geometrically configured in such a way that a cold head may be inserted, the cold head having a cold head stage via which a cryogenic working medium, which flows or drips through a heat pipe into an evaporator chamber during a condensation operation, may be cooled, and which is thermally conductively connected to the object to be cooled via a thermal contact surface, so that the cooled cryogenic working medium is able to absorb heat from the object to be cooled and transport it to the cold head stage via the heat pipe.

In most cases, cryotechnology utilizes cooling machines for cooling objects, for example superconducting magnet coils. The cooling machines discharge heat from the apparatus containing the object to be cooled by means of a cold head.

These cooling machines are typically operated with helium gas as the coolant, which is compressed in a compressor and expanded in the cold head of the cryostat (for example, so-called pulse tube coolers). The cold head and the compressor are generally connected to one another via two pressure lines. The cold head is connected to the components to be cooled, either directly mechanically or via a contact medium (for example, cryo gas or cryo liquid), or in both ways in order to ensure good heat transfer.

However, if the compressor completely or partially fails, for example due to a technical defect or power outage, the previously cooled components heat up. In this situation, the cold head of the cryostat then represents a significant thermal bridge between the components to be cooled and the external surroundings. In the persistent operating mode of a superconducting magnet, the superconducting current can flow practically without resistance for extremely long time periods. However, heating of the magnet causes a so-called quench of the persistent operating mode after a certain time. At some point, the magnet reaches the critical transition temperature, which is predetermined by the superconducting material, and becomes normally conducting and thereby loses its high magnetic field, generally abruptly.

A reduction of the thermal load after failure of the cooling machine would at least considerably extend the time period until a quench occurs. This is true in particular for cryostat configurations that can be operated completely without or with only minimum amounts of liquid coolant; superconducting magnets currently are normally operated in a liquid helium bath. Since helium is becoming increasingly expensive, cryostats that can be operated completely without or at least with minimum amounts of helium (low-loss or even cryo-free systems) are becoming more and more attractive, both technically and economically.

However, the thermal capacity of solids significantly decreases at very low temperatures. For this reason, it would be particularly important for systems of this type, using small amounts of liquid helium or no liquid helium at all, to minimize the heat input into the object to be cooled in case of failure of the cooling unit.

DE 195 33 555 A1 describes a cooling device for indirectly cooling a unit, in particular a superconducting unit, situated in a vacuum housing, and which contains at least one refrigerator portion. This refrigerator portion is composed of a section on the room temperature side and a section on the low-temperature side, protrudes into the vacuum housing, and is fastened thereto via spring elements, and at its end on the low-temperature side is thermally conductively connected to the unit to be cooled. To avoid vibrations being transmitted to the unit, it is provided that the section of the cooling machine portion on the room temperature side is situated in an evacuable space of a housing unit which is fixedly connected to the vacuum housing. This cooling device is thermally conductively connected to the unit to be cooled, so that in the event of failure of the cooling machine, the object to be cooled heats up quickly. When an LTS magnet is used, this means that a quench occurs immediately.

LTS coils are conventionally kept directly in liquid helium, which is very costly due to the fact that helium bath cryostats are very complex and therefore expensive.

DE 10 2011 078 608 A1 discloses a cryostat system comprising a vacuum container and a cryo container installed therein, and a sleeve in which a cryocooler is installed, the upper, warm end of the sleeve being connected to the outer shell, and the lower, cold end facing the cryo container being sealed gas-tight by a sleeve base, and the cryo container containing a superconducting magnet system. The known system is characterized in that the cryo container is hermetically sealed except for a gas capillary, and is filled with gaseous fluid at a pressure below the vapor pressure of the liquid phase of the fluid at the corresponding operating temperature, and the coldest stage of the cryocooler is in good thermally conductive connection with a heat exchanger situated inside the cryo container. In this way, the superconducting magnet system within the cryo container can be cooled without cryogenic liquid, and at the same time, without a direct mechanical coupling to the cryocooler; during the operating period, handling of cryogenic liquids may be dispensed with, and the discharge of cold fluid in the event of a quench of the superconducting magnet system may be avoided.

DE 10 2011 078 608 A1 describes a cryostat without cryogen and without a heat pipe. One disadvantage, however, is that if the cooling unit fails, the user has very little time ("time to quench") until the magnet heats up and loses its superconducting property. In contrast, a heat pipe can better bridge over a fairly long failure in the cooling, since the cryogen in the heat pipe evaporates first before the cryostat begins to heat up.

The advantages of a cryostat with a heat pipe with regard to the time to quench are described in the patent application DE 10 2014 218 773 cited above. This document describes a cryostat which includes a vacuum container and a chamber containing the object to be cooled, and includes a neck tube which houses a cooling arm of a cold head which is connected to a refrigeration device, and which can be brought into thermal contact with a second thermal contact surface on the object via a first thermal contact surface on the cooling arm. The described system is characterized in that the hollow volume between the inner side of the neck tube, the cooling arm, and the object is filled with gas, wherein the internal pressure of the gas pressurizes part of the cooling arm, whereas another part of the cooling arm is pressurized by atmospheric pressure, that the cooling arm can be moved with its first thermal contact surface toward or away from the second thermal contact surface, and that a contact device establishes thermal contact of the first thermal contact surface with the second thermal contact surface when the gas pressure is below a threshold pressure, and the contact device moves the first thermal contact surface away from the second thermal contact surface when the threshold pressure is exceeded, so that the contact surfaces are thermally separated by a gap filled with gas. In this way, in the event of failure of the cooling machine, the thermal load on the object to be cooled is significantly reduced automatically in an operationally reliable manner without intervention by an operator.

However, this type of cryostat requires a relatively long precooling period before it is actually started up. Heat pipes, despite their other advantages, basically are not powerful enough to quickly cool cryostats down to their working temperature, in particular in the event of failure of the cooling unit, described above. For fairly large cryostats containing, for example, an LTS coil weighing several hundred kilograms, a standard heat pipe with 40 W cooling power, with use of a single cryogen, would require several weeks to precool the coil to a working temperature of 4 K.

Even with successive use of different cryogens having different condensation temperatures in the various subareas, within the fairly large temperature difference from the original room temperature down to the very low operating temperature, a precooling time in the range of week is still required; however, this procedure is naturally extremely complicated, in particular material- and labor-intensive.

SUMMARY OF THE INVENTION

For a cryostat of the type described at the outset, having a heat pipe, the object of the invention—which, considered in detail, is relatively challenging and complex—is to significantly reduce the time required for precooling the cryostat to its operating temperature, and thus, to shorten the duration of the start-up time, using uncomplicated technical means; existing units may be retrofitted in a preferably simple manner.

This object is achieved surprisingly easily and effectively by the present invention, in that, during a precooling phase, the object to be cooled is precooled to a target temperature of the working range of the cryogenic working medium in which the heat pipe is able to operate efficiently, wherein for the precooling, a precisely fitting short circuit block with good thermal conductivity is inserted through the neck tube into the heat pipe, one free end of the short circuit block being thermally connected to a high-power cooling device, and its other end contacting the thermal contact surface, and that in an intermediate phase the short circuit block is removed from the heat pipe after the target temperature is reached, and that during an operating phase, heat is subsequently transmitted through the heat pipe during a condensation operation.

The concept underlying the present invention is based, among other things, on establishing a thermal short circuit while the cryostat (generally containing a magnet) is being cooled down, until the efficient working range of the heat pipe is reached. A heat pipe is a tube in which the working gas is cooled and condensed at the upper end, in order to then drip or flow to the lower end, where it is evaporated, thereby absorbing heat. Heat may thus be transmitted with a minor temperature gradient. Unfortunately, the working range is determined by the boiling point of the gas, and therefore is greatly limited. As mentioned above, without additional measures, the cold head of the pulse tube cooler in combination with the heat pipe is not efficient enough above the working temperature to accomplish this cooling within an adequately short time period. Therefore, according to the teaching of the present invention, the cold head is removed from the neck tube and the connecting sleeve, and a precisely fitting material core with good thermal conductivity (for example, copper, aluminum, etc.) is inserted into the cavity, resulting in the largest possible thermal contact surface with the parts to be cooled. A cooling unit is mounted on the outer side of the core, and cools the core and thus the parts of the cryostat in contact with the core. This cooling process now proceeds much more quickly, since high-power cooling units (for example, a Gifford-McMahon cooler with up to 1200 W) may be used.

As soon as the temperature has reached the efficient range of the heat pipe in the cryostat, the cooling unit and the material core may be removed and a two-stage cooler (a pulse tube cooler, for example), which provides sufficient power for continuous operation may be inserted. When the equipment is exchanged, however, it must be ensured that no air or moisture enters the cavity. This is achieved by seals and by blowing in gaseous helium, as described in greater detail below.

When helium is used as the cryogenic working medium, in the intermediate phase it is advantageous to cool the cryostat to a target temperature of 40 K-80 K, since in this range the two-stage cooler in combination with the heat pipe can operate efficiently, and the target temperature of 4 K may be reached relatively quickly. The efficiency of the two-stage cooler drops at temperatures higher than 100 K. In turn, the high-power one-stage cooler loses efficiency at very low temperatures of less than 40 K.

In addition to the cooling process, the invention also proposes a corresponding mobile precooling device with which the method according to the invention may be carried out. The cooling device includes the precisely fitting material core with good thermal conductivity and the high-power cooling unit, which is operated with the same compressor as the pulse tube cooler of the cold head in the heat pipe (connecting sleeve). The connecting sleeve requires a connection for the cryogen supply, so that when a change is made from the precooler to the pulse tube cooler, the resulting cavity is completely flooded with the working cryogen, generally helium.

In a preferred variant of the method according to the invention the cryogenic working medium is blown into the inner space of the neck tube during the removal of the short circuit block from the neck tube in the intermediate phase, and during insertion/placement of the cooling device or the cold head through the neck tube at the start of the operating phase, so that the heat pipe is loaded with the cryogenic working medium. This prevents air from penetrating into the neck tube area and freezing at that location. The contact surfaces must be free of ice to ensure optimal heat transfer.

In another advantageous method variant of the invention, the cryogenic working medium is selected from the following group: helium, neon, nitrogen, hydrogen, or carbon dioxide, depending on the temperature range to be reached in the operating phase. It is thus possible to achieve various working temperatures in different temperature ranges.

Also particularly preferred are variants of the method according to the invention in which it is provided that in the intermediate phase, the high-power cooling device having the short circuit block is exchanged with a two-stage cryocooler having a cold head stage.

The present invention further relates to a cryostat for carrying out the method according to the invention described above in detail, which is characterized in that a gas supply device for blowing the cryogenic working medium into the common inner space of the neck tube, heat pipe, and evaporator chamber is present, so that a gas flow in the direction of the neck tube may be provided which prevents air and/or moisture from penetrating into the cryostat during the removal of the short circuit block from the neck tube during the intermediate phase, and during insertion of the heat pipe through the neck tube at the start of the operating phase, and which at the same time loads the heat pipe. This prevents air from penetrating into the neck tube area and freezing at that location. The contact surfaces must be free of ice to ensure optimal heat transfer.

In one advantageous embodiment of the cryostat according to the invention, a sealing device is present which prevents gas exchange from the neck tube to the ambient air.

In one embodiment of the invention which is particularly simple but important, the short circuit block is manufactured so that its outer circumference makes a precise geometric fit with the outer circumference of the heat pipe. Optimal use is thus made of the cross section of the heat pipe in order to transfer the largest possible quantity of heat.

Further preferred embodiments of the cryostat according to the invention provide that the short circuit block is made of a material having a thermal conductivity of >200 W/m·K, in particular copper or aluminum.

Also advantageous are embodiments characterized in that the high-power cooling device is protected from undesirable external heat input by a vacuum device and/or an insulating jacket.

In another embodiment, a tank containing liquid helium is present, with which the thermal contact surface may be cooled with respect to the object to be cooled (generally a superconducting magnet), but the object to be cooled itself is not situated in a tank containing liquid helium. This small tank increases the operational reliability of the magnet in the event of a power outage.

Lastly, in one class of preferred embodiments which have proven to be particularly satisfactory in practice, the high-power cooling device has a cooling power of at least 300 W, preferably at least 500 W, at 80 K.

The present invention further relates to a magnetic resonance system having a superconducting magnet coil, in particular an NMR spectrometer system or an NMR tomography system, but also an MRI or FTMS apparatus, each including a cryostat according to the invention as described above. Due to the present invention, the superconducting magnet coil of the magnetic resonance system is protected particularly well from a quench of the persistent operating mode, and is therefore particularly well suited for high-resolution measurements. A magnetic resonance system of this type typically includes at least one magnet which is generally superconducting and which is situated in a cryostat, as well as high-frequency components, for example HF coils, in a room temperature bore of the cryostat, and a sample position for a sample to be measured. "Normal" conventional high field NMR spectrometers operate at a proton resonance frequency between approximately 200 MHz and 500 MHz. In contrast, a high field NMR spectrometer with ultra-high resolution can be operated nowadays at proton resonance frequencies≥800 MHz.

Further advantages of the invention result from the description and the drawings. In addition, in each case the features mentioned above and explained in greater detail below may be used according to the invention, individually or collectively in any combination. The embodiments shown and described are not to be construed as an exhaustive listing, but, rather, are exemplary in nature for describing the invention.

BRIEF DESCRIPTION OF THE DRAWINGS

The invention is illustrated in the drawings and is explained in greater detail with reference to exemplary embodiments, as follows.

DETAILED DESCRIPTION

Figure 1A:
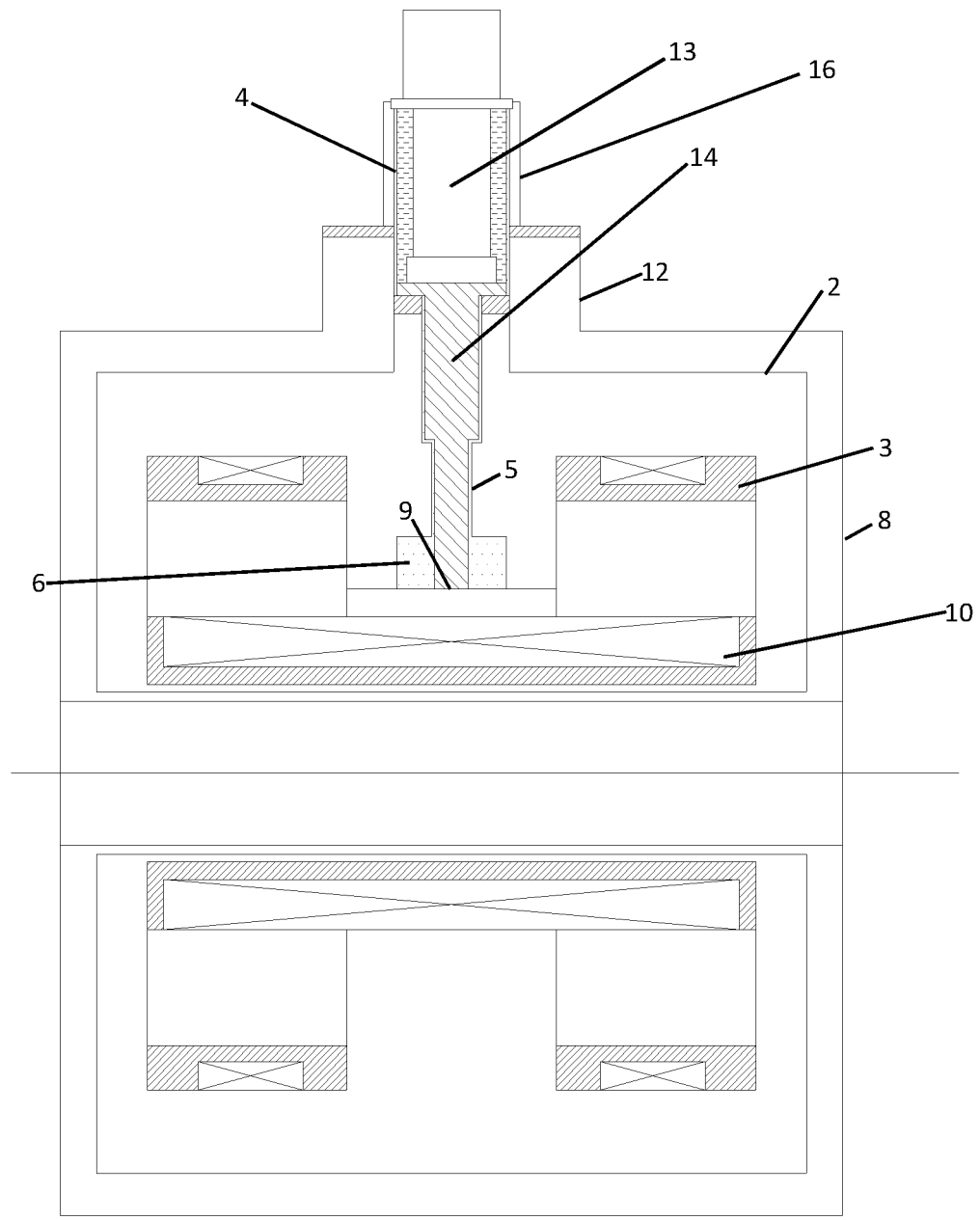
FIG. 1a shows a schematic vertical sectional view of one embodiment of a cryostat according to the invention, with a short circuit block during the precooling phase, for example a high-power Gifford-McMahon cooler, in an NMR spectrometer or NMR tomography device having a horizontal magnet system.
Figure 1B:
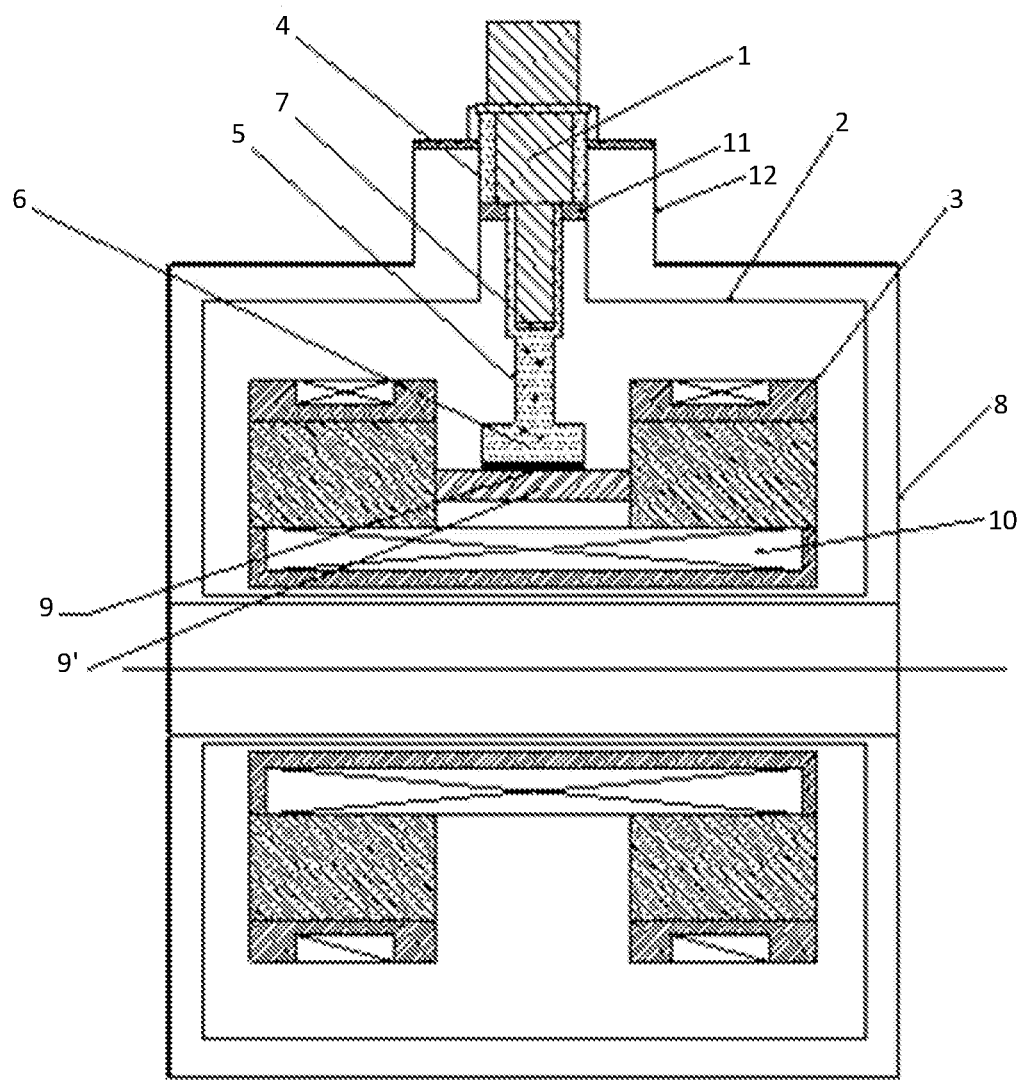
FIG. 1b shows a configuration with a heat pipe according to the prior art, similar to the cryostat in FIG. 1a, but without the modifications according to the invention, and having a pulse tube cooler during continuous operation.
Figure 2A:
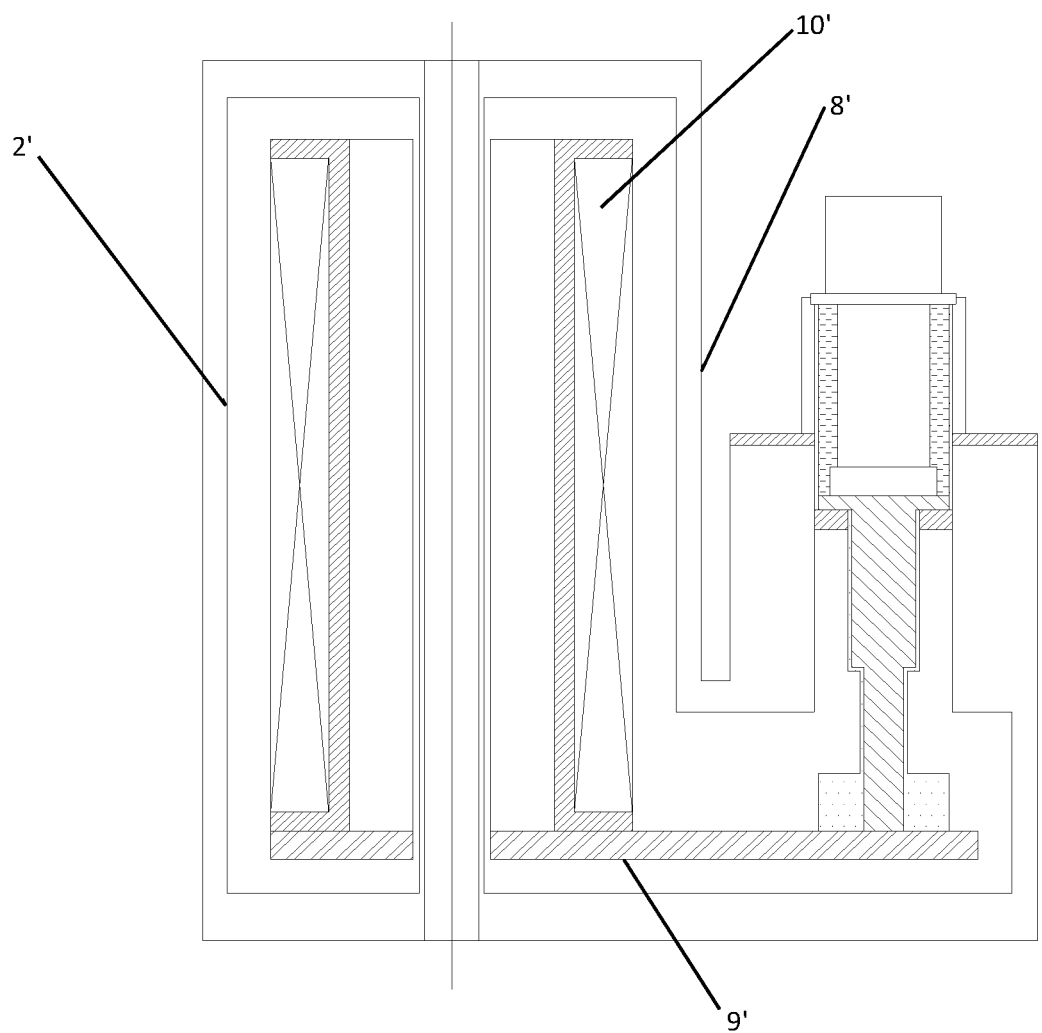
FIG. 2a shows a schematic vertical sectional view of another embodiment of the cryostat according to the invention with functional features similar to FIG. 1a during the precooling phase, but in an NMR spectrometer or NMR tomography device having a vertical magnet system.
Figure 2B:
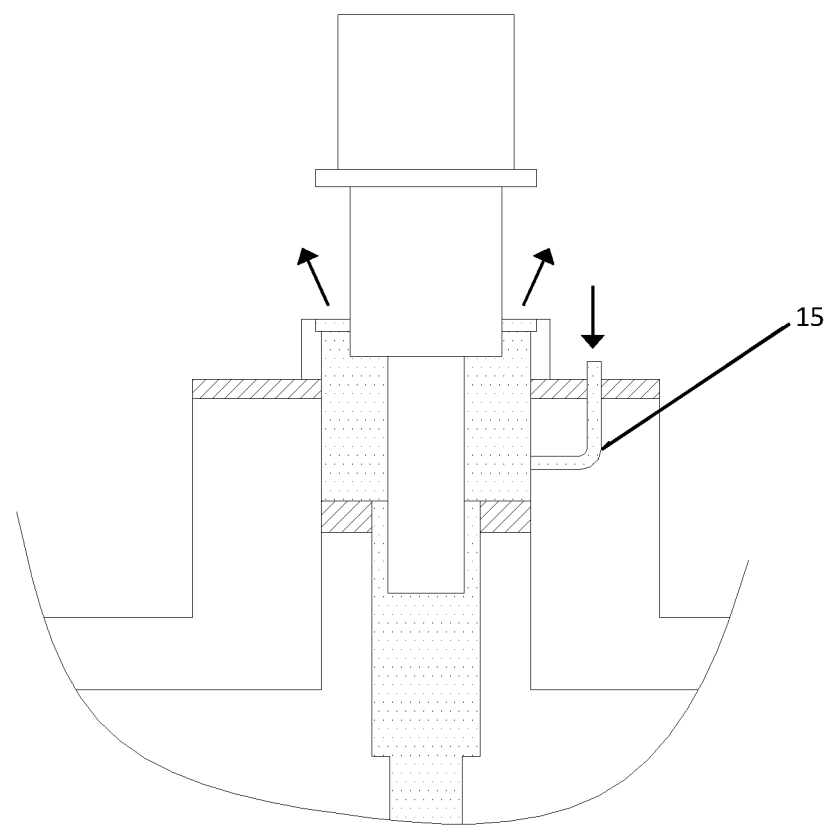
FIG. 2b shows a configuration similar to FIG. 2a, but in greater detail and during the intermediate phase after the target temperature is reached, when the short circuit block is removed from the heat pipe, in this case a gas supply device for blowing the cryogenic working medium into the shared inner space of the neck tube, heat pipe, and evaporator chamber being present.

FIGS. 1a, 2a, and 2b each show a schematic vertical sectional view of embodiments of the cryostat according to the invention, while FIG. 1b shows a cooling system with a heat pipe according to the prior art.

All cryostats illustrated in the drawings have a vacuum container which houses a chamber containing at least one object 10; 10' to be cooled, the vacuum container having at least one hollow cold head turret 12 into which a neck tube 4, which connects the chamber through the outer shell 8; 8' of the vacuum container to the area outside of the cryostat, protrudes, the neck tube 4 being geometrically configured in such a way that a cold head 1 may be introduced, the cold head having a (generally, second) cold head stage 7 via which a cryogenic working medium, which flows or drips through a heat pipe 5 into an evaporator chamber 6 during a condensation operation, may be cooled, and which is thermally conductively connected to the object 10; 10' to be cooled via a thermal contact surface 9; 9', so that the cooled cryogenic working medium is able to absorb heat from the object 10; 10' to be cooled and transport it to the cold head stage 7 via the heat pipe 5.

The chamber containing the object 10; 10' to be cooled is surrounded by a radiation shield 2; 2' inside the vacuum container.

A connection 11 having good thermal conductivity is provided between the radiation shield 2; 2' and a first stage of the cold head 1.

The object 10; 10' to be cooled is generally a superconducting NMR coil system mounted on or in a coil body 3.

According to the invention, in the cryostats shown in FIGS. 1a, 2a, and 2b, during a precooling phase the object 10; 10' to be cooled is precooled to a target temperature of the working range of the cryogenic working medium in which the heat pipe 5 is able to operate efficiently, wherein for the precooling, a precisely fitting short circuit block 14 with good thermal conductivity is inserted through the neck tube 4 into the heat pipe 5, one free end of the short circuit block being thermally connected to a high-power cooling device 13, and its other end contacting the thermal contact surface 9; 9'. In an intermediate phase the short circuit block 14 is removed from the heat pipe 5 after the target temperature is reached, and during an operating phase, heat is subsequently transmitted through the heat pipe 5 during a condensation operation.

The cryogenic working medium is blown into the inner space of the neck tube 4 during the removal of the short circuit block 14 from the neck tube 4 in the intermediate phase, and during insertion/placement of the cooling device 13 or the cold head 1 through the neck tube 4 at the start of the operating phase, so that the heat pipe 5 is loaded with the cryogenic working medium.

The cryogenic working medium is selected from helium, neon, nitrogen, hydrogen, or carbon dioxide, depending on the temperature range to be reached in the operating phase.

In the intermediate phase, the high-power cooling device 13 having the short circuit block 14 is replaced by a two-stage cryocooler having a cold head stage 7.

The cryostat according to the invention is characterized in that a gas supply device 15 for blowing the cryogenic working medium into the shared inner space of the neck tube 4, heat pipe 5, and evaporator chamber 6 is present, so that a gas flow in the direction of the neck tube may be provided which prevents air and/or moisture from penetrating into the cryostat during the removal of the short circuit block 14 from the neck tube 4 during the intermediate phase, and during insertion of the heat pipe 5 through the neck tube 4 at the start of the operating phase, and which at the same time loads the heat pipe 5.

A sealing device is generally present which prevents gas exchange from the heat pipe 5 to the ambient air.

The short circuit block 14 is made of a material having a thermal conductivity of >200 W/m·K, in particular copper or pure aluminum, so that its outer circumference makes a precise geometric fit with the outer circumference of the heat pipe 5.

The high-power cooling device 13 has a cooling power of at least 300 W, preferably at least 500 W, at 80 K, and is protected from undesirable external heat input by a vacuum device and/or an insulating jacket 16, since the cooling device protrudes from the neck tube, and in this area must be shielded from lateral heat input from the surroundings.

In the embodiments of the invention illustrated in the drawings, a tank containing liquid helium is present, with which the thermal contact surface 9; 9' may be cooled with respect to the object 10; 10' to be cooled, but the object 10; 10' to be cooled itself is not situated in a tank containing liquid helium.

In the embodiment shown in FIG. 1a, the cryostat according to the invention is part of an NMR apparatus having a horizontal magnet system.

In comparison, FIG. 1b shows a cryostat according to the prior art, as described, for example, in patent application DE 10 2014 218 773, unpublished at the time of filing of the present invention.

The embodiments of the cryostat according to the invention illustrated in FIGS. 2a and 2b are in each case part of an NMR apparatus having a vertical magnet system.

FIG. 2b shows one embodiment of the invention in which a gas supply device 15 for the cryogen is provided when the short circuit block 14 (FIG. 1a) having the high-power cooling device 13 is exchanged with a pulse tube cooler. The direction of flow of the cryogen during the exchange is indicated by arrows.

In one advantageous design, the high-power cooling device 13 is a Stirling cooler, not a Gifford-McMahon cooler. These coolers are even more efficient, but require a dedicated compressor and are more costly.

The high-power cooling device 13 and the pulse tube cooler are preferably operated with the same compressor unit.

LIST OF REFERENCE NUMERALS

1 Cold head
2; 2' Radiation shield
3 Coil body
4 Neck tube
5 Heat pipe
6 Evaporator chamber
7 Cold head stage (second stage)
8; 8' Outer shell
9; 9' Thermal contact surface
10; 10' Object to be cooled
11 Radiation shield-cold head connection (first stage)
12 Cold head turret
13 Cooling device
14 Short circuit block
15 Gas supply device
16 vacuum device and/or insulating jacket

The invention claimed is:

1. A method for operating a cryostat comprising a vacuum container that houses an object to be cooled, the vacuum container having a neck tube that connects the vacuum container to an area outside of the cryostat, the method comprising:

maintaining a temperature of the object to be cooled during an operating phase by locating a cold head of a two-stage cooler in the neck tube such that the cold head cools a cryogenic working medium that condenses and flows through a heat pipe to a thermal contact surface that is thermally conductively connected to the object to be cooled, the working medium absorbing heat from the thermal contact surface, evaporating and returning to the cold head via the heat pipe; and prior to locating the two-stage cooler in the neck tube, cooling the vacuum chamber during a pre-cooling phase by inserting a short circuit block into the neck tube, the short circuit block fitting within the neck tube and the heat pipe and having a first end external to the heat pipe that is thermally connected to a cooling device and a second end in contact with the thermal contact surface, the short circuit block comprising a thermally conductive material core that facilitates cooling of the thermal contact surface by the cooling device.

2. The method according to claim 1 further comprising blowing the cryogenic working medium into the neck tube during removal of the short circuit block and the insertion of the two-stage cooler into the neck tube so as to minimize an entry of ambient gas into the neck tube while providing the working medium to the heat pipe.

3. The method according to claim 1, wherein the cryogenic working medium comprises at least one of helium, neon, nitrogen, hydrogen and carbon dioxide.

4. The method according to claim 1 wherein an outer contour of the short circuit block lies adjacent to an inner contour of the heat pipe when the short circuit block is located therein.

5. The method according to claim 1 wherein the short circuit block comprises a material having a thermal conductivity of more than 200 W/m·K.

6. The method according to claim 5 wherein the short circuit block comprises at least one of copper and aluminum.

7. The method according to claim 1 wherein the object to be cooled has no direct contact with the working medium.

8. The method according to claim 1 wherein the cooling device has a cooling power of at least 300 W at 80 K.

9. A method for operating a cryostat comprising a vacuum container that houses an object to be cooled, the vacuum container having a neck tube that connects the vacuum container to an area outside of the cryostat, the method comprising:
maintaining a temperature of the object to be cooled during an operating phase by locating a cold head of a two-stage cooler in the neck tube such that the cold head cools a cryogenic working medium that condenses and flows through a heat pipe to a thermal contact surface that is thermally conductively connected to the object to be cooled, the working medium absorbing heat from the thermal contact surface, evaporating and returning to the cold head via the heat pipe;
prior to locating the two-stage cooler in the neck tube, cooling the vacuum chamber during a pre-cooling phase by inserting a short circuit block into the neck tube, the short circuit block fitting within the neck tube and heat pipe and having a first end external to the heat pipe that is thermally connected to a cooling device and a second end in contact with the thermal contact surface, the short circuit block comprising a thermally conductive material core that facilitates cooling of the thermal contact surface by the cooling device and an outer contour that lies directly adjacent to an inner contour of the heat pipe when located therein; and
blowing the cryogenic working medium into the neck tube during removal of the short circuit block and insertion of the two-stage cooler into the neck tube so as to minimize an entry of ambient gas into the vacuum chamber while providing the working medium to the heat pipe.

10. A method for cooling down a cryostat comprising a vacuum container that houses an object to be cooled, the vacuum container having a neck tube that connects the vacuum container to an area outside of the cryostat, the method comprising:

cooling the vacuum chamber during a pre-cooling phase to a first target temperature by inserting a short circuit block into the neck tube, the short circuit block fitting within the neck tube and having a first end external to the heat pipe that is thermally connected to a cooling device and a second end in contact with a thermal contact surface that is thermally conductively connected to the object to be cooled, the short circuit block comprising a thermally conductive material core that facilitates cooling of the thermal contact surface by the high-power cooling device;
removing the short circuit block from the neck tube in an intermediate phase when the first target temperature is reached and introducing a two-stage cooler with a cold head into the neck tube and cooling the vacuum chamber to a second target temperature which is below the first target temperature; and
maintaining the second target temperature of the object to be cooled during an operating phase with the two-stage cooler located in the neck tube.

11. The method according to claim 10 further comprising blowing a cryogenic working medium into the neck tube during the removal of the short circuit block and the insertion of the two-stage cooler so as to minimize an entry of ambient gas into the neck tube while providing the working medium to a heat pipe inside the neck tube between the cold head and the thermal contact surface.

12. The method according to claim 11, wherein during the operating phase the cold head cools the cryogenic working medium that condenses and flows through the heat pipe to the thermal contact surface, the working medium absorbing heat from the thermal contact surface, evaporating and returning to the cold head via the heat pipe.

13. The method according to claim 12, wherein the cryogenic working medium comprises at least one of helium, neon, nitrogen, hydrogen and carbon dioxide.

14. The method according to claim 13, wherein the cryogenic working medium is helium and the first target temperature is from 40 K to 80 K and the second target temperature is 4 K.

15. The method according to claim 12 wherein the object to be cooled has no direct contact with the working medium.

16. The method according to claim 10 wherein an outer contour of the short circuit block lies directly adjacent to an inner contour of the neck tube when the short circuit block is located therein.

17. The method according to claim 10 wherein the short circuit block comprises a material having a thermal conductivity of more than 200 W/m·K.

18. The method according to claim 17 wherein the short circuit block comprises at least one of copper and aluminum.

19. The method according to claim 10 wherein the cooling device has a cooling power of at least 300 W at 80 K.

* * * * *